United States Patent
Lin et al.

(10) Patent No.: US 7,915,704 B2
(45) Date of Patent: Mar. 29, 2011

(54) SCHOTTKY DIODE

(75) Inventors: Xin Lin, Phoenix, AZ (US); Daniel J. Blomberg, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 153 days.

(21) Appl. No.: 12/359,845

(22) Filed: Jan. 26, 2009

(65) Prior Publication Data

US 2010/0187577 A1    Jul. 29, 2010

(51) Int. Cl.
*H01L 29/872*    (2006.01)

(52) U.S. Cl. ................ 257/476; 257/281; 257/E29.271; 438/167

(58) Field of Classification Search .................. 257/476, 257/E29.271, 280–281; 438/167
See application file for complete search history.

(56) References Cited

U.S. PATENT DOCUMENTS

| | | | |
|---|---|---|---|
| 4,513,309 A * | 4/1985 | Cricchi | 257/376 |
| 5,929,502 A * | 7/1999 | Beasom | 257/497 |
| 6,423,986 B1 * | 7/2002 | Zhao | 257/138 |
| 7,064,407 B1 * | 6/2006 | Mallikarjunaswamy | 257/471 |
| 7,282,386 B2 * | 10/2007 | Khemka et al. | 438/92 |
| 7,355,260 B2 | 4/2008 | Khemka et al. | |
| 7,416,929 B2 * | 8/2008 | Mazzola et al. | 438/186 |
| 2002/0127787 A1 * | 9/2002 | Huang et al. | 438/172 |
| 2008/0121895 A1 * | 5/2008 | Sheppard et al. | 257/76 |
| 2010/0032731 A1 * | 2/2010 | Babcock et al. | 257/280 |

* cited by examiner

*Primary Examiner* — Allan R Wilson
(74) *Attorney, Agent, or Firm* — Ingrassia Fisher & Lorenz, P.C.

(57) ABSTRACT

Improved Schottky diodes (20) with reduced leakage current and improved breakdown voltage are provided by building a JFET (56) into the diode, serially located in the anode-cathode current path (32). The gates of the JFET (56) formed by doped regions (38, 40) placed above and below the diode's current path (32) are coupled to the anode (312) of the diode (20), and the current path (32) passes through the channel region (46) of the JFET (56). Operation is automatic so that as the reverse voltage increases, the JFET (56) channel region (46) pinches off, thereby limiting the leakage current and clamping the voltage across the Schottky junction (50) at a level below the Schottky junction (50) breakdown. Increased reverse voltage can be safely applied until the device eventually breaks down elsewhere. The impact on device area and area efficiency is minimal and the device can be built using a standard fabrication process so that it can be easily integrated into complex ICs.

17 Claims, 3 Drawing Sheets

SCHOTTKY DIODE

FIELD OF THE INVENTION

The present invention generally relates to electronic devices and integrated circuits (ICs) and their methods of manufacture, and more particularly, structures and methods for forming Schottky diodes.

BACKGROUND OF THE INVENTION

Schottky diodes are much used in modern electronic devices, especially integrated circuits (ICs). However, their performance and area efficiency are often less than ideal. Area efficiency refers to the chip area needed to obtain a Schottky diode of a given forward conduction capability, more precisely, the area efficiency is the ratio of the Schottky contact area to the total device area. For a given Schottky contact work function and Schottky contact area, the larger the overall device area for a given current handling capability, the lower the area efficiency. Excess reverse bias leakage is also often a troublesome performance limitation. Means and methods used in the prior art to limit the reverse bias leakage have typically caused a significant increase in the total area occupied by the Schottky device and therefore a further decrease in the area efficiency. It is well known that manufacturing cost of semiconductor devices and integrated circuits (ICs) is directly related to device and chip area. The larger the chip area needed to contain the required devices, the higher the manufacturing cost since the chips are generally batch fabricated in wafers of fixed diameter. A bigger chip means fewer chips per wafer and thus higher individual chip cost. Another consideration for Schottky diodes included in integrated circuits (ICs) is that they are desirably formed using the same technology and processing steps available for forming the IC. This complicates the problem of manufacturing area efficient low leakage Schottky diodes since the available manufacturing process steps are constrained by the process needs of the remainder of the IC, and therefore may be less than ideal for forming the Schottky diodes. Thus, a need continues to exist for improved Schottky diode structures using processes that are compatible with available IC manufacturing technology, especially for Schottky diodes having low reverse leakage and good area efficiency.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
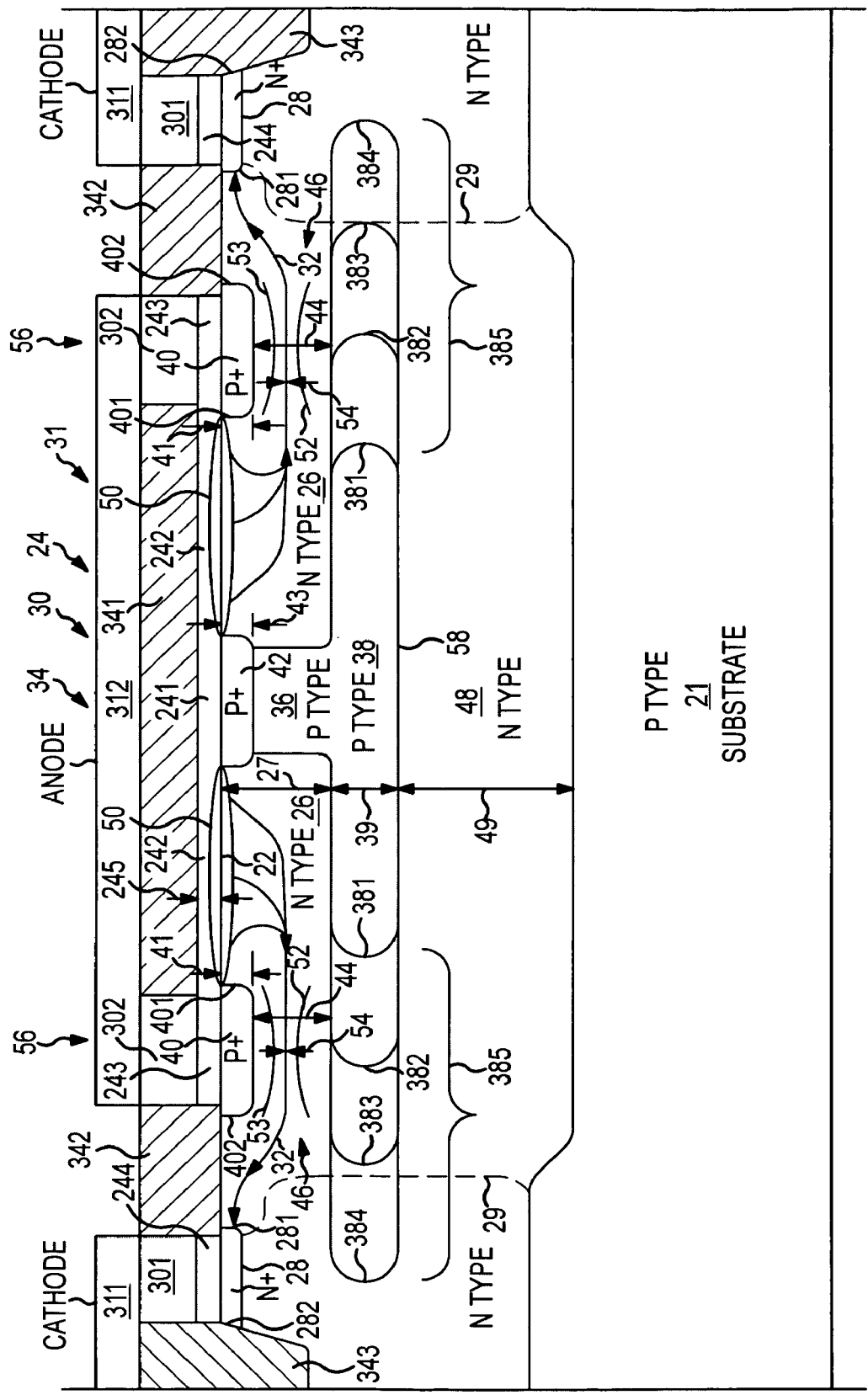
FIG. 1 is a simplified schematic cross-sectional view of a Schottky diode, according to several embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing among similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting, semiconductor-on-insulator (SOI) structures, and combinations thereof. The term "semiconductor" is abbreviated as "SC." The term "complementary-metal-oxide-semiconductor" and the abbreviation CMOS are well known in the art to refer to a technology much used for integrated circuits (ICs). Unless otherwise specifically noted, the term "oxide" in connection with such MOS devices or ICs is intended to include any form of insulating dielectric whether organic or inorganic and not be limited merely to compounds containing oxygen. Similarly, unless otherwise specifically noted, terms "metal," "metal layers," "metallization" and "metallization layers" in connection with such MOS devices or ICs are intended to include any type of electrical conductor, whether organic or inorganic, metallic or non-metallic. Non-limiting examples of such conductors are doped semiconductors, semi-metals, alloys and mixtures, combinations thereof, and so forth. For convenience of explanation and not intended to be limiting, semiconductor devices and methods of fabrication may be described herein for silicon semiconductors but persons of skill in the art will understand that other semiconductor materials can also be used. Further, while the formation of Schottky diodes is described herein for the case where they are intended to be incorporated in CMOS ICs, persons of skill in the art will understand that they may be formed using the principles taught herein in connection with ICs incorporating any type of active device, whether other types of field effect devices (FETs) or bipolar devices or otherwise.

Figure 2:
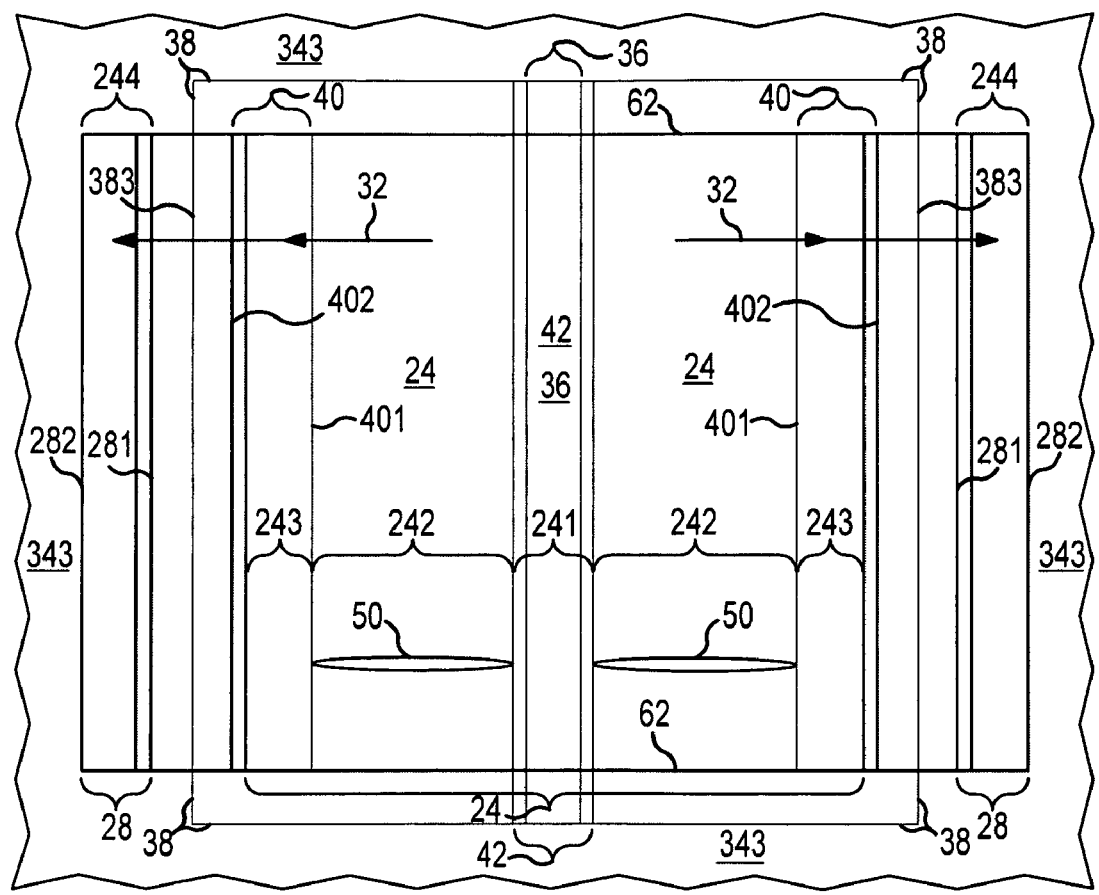
FIG. 2 is a simplified plan view of the Schottky diode of FIG. 1 illustrating lateral placement of the various regions thereof, according to a further embodiment of the present invention.

FIG. 1 is a simplified schematic cross-sectional view of Schottky diode 20, according to several embodiments of the present invention. FIG. 2 is a simplified plan view of Schottky diode 20 of FIG. 1 illustrating lateral placement of various regions thereof, according to a further embodiment of the present invention wherein a rectangular, parallel facing arrangement is adopted for Schottky diode 20 of FIG. 1. Other plan view shapes can also be used in further embodiments, and FIG. 2 is intended to be illustrative and not limiting. In order to avoid unduly cluttering the drawing, surface conductor layers and surface dielectric layers, with the exception of conductor regions 241, 242, 243, 244 and shallow dielectric filled trench isolation region 343, are omitted in FIG. 2. As will be subsequently explained, because region 38, 42, 36 and other regions lie beneath various other layers or regions shown in FIG. 2 in whole or part, they are shown in FIG. 2 by means of lighter weight lines.

Considering FIGS. 1-2 together, Schottky diode 20 is formed on semiconductor (SC) substrate 21, for example of P type silicon, having upper surface 22. Substrate 21 has therein N type buried layer region 48 of thickness 49. Overlying a central part of region 48 is P type buried region 38 of thickness 39 and varying lateral extent, according to various embodiments of the invention. P type buried region 38 has lateral extent (in various embodiments) 381, 382, 383, 384, etc., e.g., any where in zone 385. Substrate 21 further has N type regions 26 of thickness 27 between buried region 38 and SC surface 22. P+ doped regions 40, 42 of thickness 41, 43 are provided in N type region 26 at semiconductor surface 22. P+ region 42 is desirably laterally centrally located and ohmically coupled to P type buried region 38 by P type region 36, also desirably laterally centrally located. However, regions 42, 36 can in other embodiments be located laterally in other positions. P+ regions 40 are desirably laterally separated from P+ region 42 and the intervening portions of surface 22 of SC substrate 21 are where the actual Schottky contact of device 20 is located. N+ regions 28 are located at SC surface 22 laterally at the periphery of N type regions 26 or in adjacent N type regions 29, which are ohmically coupled to each other and to region 48. Conductive layer 24 is provided on upper SC surface 22. Layer 24 has central portion 241 that makes ohmic contacts to P+ region 42, laterally separated portions 243 that make ohmic contact to P+ region 40 and further laterally separated portions 244 that make ohmic contact to N+ region 28. Portions 242 of layer 24 on SC surface 22 laterally between regions 241 and 243 form Schottky contact or junction 50 to N type SC region 26 at SC surface 22. The oval shape associated with reference number 50 in FIGS. 1 and 2 is intended merely to indicate the location of the Schottky contact or junction 50 and not its shape, since it is ordinarily planar being formed at the interface between conductor portion 242 and surface 22 of N type region 26. Portions 244 of layer 24 forms ohmic contact to N+ regions 28, laterally separated from P+ regions 40. Pt, Ni and PtNi alloys and various silicides are examples of suitable conductors for layer 24 of thickness 245, adapted to form Schottky contacts or junctions 50 with underlying intermediately doped N type silicon semiconductor region 26 in portions 242, and ohmic contacts to more heavily doped regions 40, 42 and 28. NiSi and CoNiSi are preferred for layer 24, but other relatively high work function conductors may also be used, both with silicon and with other semiconductors, as is well known in the art. Conductive plugs 301, 302 (collectively 30) make ohmic contact to conductor portions 244, 243 respectively of (e.g., silicide) layer 24. Tungsten is an example of a suitable material for conductive plugs 301, 302 but other conductive materials well known in the art can also be used. Overlying (e.g. "first") metal layer 31 has terminal portions 311 that make ohmic contact to plug regions 301, and therefore to conductor (e.g., silicide) portions 244, N+ regions 28, N type regions 29, 26 and buried layer region 48 to which N+ region 28 is also ohmically coupled. Copper is an example of a suitable material for metal layer 31 but other conductive materials well known in the art can also be used. Metal layer 31 has terminal portions 312 that makes ohmic contact to plug regions 302 and therefore to conductor (e.g., silicide) portion 243, 242 and 241, P+ regions 40 and 42, and via P+ region 42 to P type region 36 and P type buried region 38 to which P+ regions 42 is ohmically coupled. For manufacturing convenience, dielectric region 341 is conveniently provided between terminal portion 312 and conductor region 242, but may be omitted in other embodiments. Dielectric regions 342 are desirably provided to laterally separate conductive plugs 301 and 302. Dielectric filled shallow trench regions 343 are provided lying laterally outside of conductive plugs 301 to laterally isolate device 20 from other devices on the same die, and may be considered to define the outer lateral boundary of device 20. Dielectric regions 342, 343 are referred to collectively as dielectric regions 34.

Terminal portion 312, together with conductive plugs 302 with underlying conductor portions 243 and adjacent conductor portions 242, 241, provides one terminal of Schottky diode 20, e.g., the anode. Terminal portions 311, together with conductive plugs 301 plus underlying conductor portions 244 and N+ regions 28 that are ohmically coupled to N type regions 26 (and portions 46 of N type regions 26), forms the other terminal of Schottky diode 20, e.g., the cathode terminal. N+ region 28 has inner periphery 281 and outer periphery 282. As indicated by current paths 32, anode-cathode current flows through N type regions 26, including portions 46 of N type regions 26 and N type regions 29 when present, between the Schottky contact or junction 50 formed by portions 242 of conductor 24 in contact with surface 22 of N type region 26, and N+ region 28. The direction of current flow will depend upon whether Schottky diode 20 is forward or reverse biased. In some embodiments, N type regions 29 of slightly higher doping than N type regions 26 may be provided below N+ regions 28 to reduce the ON-resistance, but may be omitted in other embodiments where regions 26 extend laterally to overlap or enclose regions 28. Conductor (e.g., silicide) portions 242 on SC surface 22 in contact with N type SC regions 26 provide a Schottky diode contact or junction 50. However, such a Schottky diode may have less than the desired performance. Accordingly, further regions 36, 38, 40, 42 are provided according to the present invention to reduce the reverse bias leakage and improve the breakdown voltage while preserving the relatively good area efficiency of the Schottky diode formed by elements 242 and 26.

It has been found that the performance of Schottky diode 20 can be significantly improved over the prior art by including further P type SC regions 36 and 38, and P+ SC regions 40 and 42. P+ regions 40, 42 are ohmically coupled to Schottky contact forming (e.g., silicide) portion 242 (e.g., via regions 241, 243) of conductor layer 24. P+ regions 40, 42 may have the same or different depths 41, 43. For manufacturing convenience, P+ regions 40, 42 are desirably formed at the same time and have substantially the same depth, that is, depth 41 and depth 43 are about equal, but in other embodiments they may be formed separately and have different depths. P+ region 40 is located beneath portion 243 of conductor layer 24 preferably approximately at or near the outer periphery of portions 242 and P+ region 42 is located beneath portion 241 of, e.g., silicide, layer 24, preferably centrally. P+ region 40 has inner periphery 401 and outer periphery 402. While the indicated locations of P+ regions 40, 42 with respect to Schottky contact forming conductor portions 242, are preferred, in other embodiments, they may be located elsewhere beneath conductor layer 24 as long as region 40 lies above or nearly above P type buried region 38 somewhere along current path 32 between conductor portions 242 forming Schottky contact or junction 50, and N+ contact region 28.

Beneath P+ region 42 is P type sinker region 36 that connects P+ region 42 and P type buried region 38 of thickness 39. As will be subsequently explained in more detail later, buried region 38 can have outer lateral boundary desirably anywhere in zone 385 but other locations are also useful. For purposes of illustration and not intended to be limiting, four examples are shown of the lateral periphery of buried region 38 in locations 381, 382, 383 and 384. To avoid unduly cluttering the drawing only location 383 is shown in FIG. 2. In one embodiment (see FIG. 1), outer lateral boundary 381 of P type buried region 38 lies near but inside inner lateral boundary 401 of P+ region 40. In another embodiment, outer lateral boundary 382 of region 38 lies between inner lateral boundary 401 and outer lateral boundary 402 of P+ region 40. In a still another embodiment, lateral boundary 383 lies between outer lateral boundary 402 of P+ region 40 and inner lateral boundary 281 of N+ (e.g., cathode) region 28. In a yet another embodiment, outer lateral boundary 384 lies between inner and outer lateral boundaries 281, 282 of N+ region 28, but other locations may also be used, provided that they permit portion 46 of N type regions 26 to be pinched off, as will be subsequently explained. This relationship may be easily seen in FIG. 1, and in the case of lateral boundary 383 also in FIG. 2. Stated another way, lateral outer periphery 381, 382, 383, 384, etc., of buried region 38 can conveniently lie anywhere in zone 385, but other locations can also be used provided the above-noted pinch-off condition can be satisfied.

By virtue of P type sinker region 36 coupling P type buried region 38 to P+ region 42 and thence to the anode voltage via conductor portions 241, 242, 243, plugs 302 and terminal 312, the potential of P type buried layer region 38 follows the anode potential of Schottky device 20. The same occurs with P+ region 40, by virtue of conductor portions 243, plugs 302 and terminal 312, that is, the potential of P+ region 40 also follows the anode potential of the Schottky device 20. Assume for the moment that buried region 38 has lateral boundary 383. P+ region 40 and P type region 38 are separated by distance 44 through portion 46 of N type region 26 lying between P+ region 40 at SC surface 22 and P type buried region 38. The combination of P+ region 40, portion 46 of N type region 26 and P type buried region 38 form dual-gate junction field effect transistor (JFET) 56 that is serially coupled in anode-cathode current path 32 of Schottky diode 20. As reverse bias is applied to terminals 312, 311 of Schottky diode 20, portion 46 of JFET 56 begins to deplete of carriers as indicated by contours 52, 53. As the reverse bias is increased, depletion contours 52, 53 approach each other as indicated by arrows 54 until portion 46 of N type region 26 (the channel region of JFET 56) is fully depleted and JFET 56 is in cut-off. Upon the pinch-off of portion 46 of N type region 26, the electrical potential near the Schottky contact or junction 50 (formed by conductor portions 242 on SC surface 22 of N type regions 26) is clamped. Thus, the potential drop across Schottky contact or junction 50 remains unchanged even though the reverse bias voltage may continue to increase. This condition limits the leakage current through Schottky contact or junction 50. Thus, in this voltage range the leakage current through Schottky diode 20 is lower than what is experienced with prior art Schottky diodes that lack series coupled automatic JFET 56. It will be noted that this cut-off action of series JFET 56 is entirely automatic. No separate external contacts or biasing arrangements are needed in order to limit the reverse bias leakage current, nor is any significant increase in the Schottky diode area needed to do this. Accordingly, the leakage current performance of Schottky diode 20 is improved without a significant decrease in area efficiency. This is highly desirable and a significant advance in the art. The overall Schottky diode area is substantially the same as if regions 36, 38, 40 and 42 were not present.

It will be apparent to those of skill in the art based on the teachings herein, that similar JFET pinch-off action can occur even when buried region 38 has lateral periphery 381, 382 or 384, relative to P+ region 40, in fact substantially anywhere in lateral zone 385 and even further provided that pinch-off of JFET 56 can be achieved at the desired voltage, generally less than the breakdown voltage of junction 58 between P type buried region 38 and N type buried layer 48 or elsewhere in device 20. As long as the field developed between buried region 38 and P+ region 40 is sufficient to pinch off region 46 lying between them, then JFET 56 is effective and the leakage current is clamped and higher breakdown voltage can be obtained. It is desirable that lateral periphery location 381, 382, 383, 384, etc., be placed so that JFET 56 pinches off with the greatest desired effect, typically below the inherent breakdown voltage of other device regions so that the leakage current is limited in the voltage range of interest. Accordingly, locations 382, 383 are generally preferable to locations 381, 384 depending upon the impact on forward resistance of the Schottky diode, but other locations may also be used.

It is advantageous that regions 242, 28 and 40 be arranged so that current path 32 under reverse bias must pass beneath region 40, and between regions 40 and 38, in transiting between Schottky junction 50 and contact 28, that is, that there be no "sneak paths" by which current 32 can flow from Schottky junction 50 to contact 28 without passing between regions 40 and 38. If regions or portions 242, 50, 40, 38 and 28 are circular in plan view then there can be no sneak path. However, such a circular plan view arrangement is not always the most area efficient layout. It has been found that the same no "sneak path" effect can be created using the more area efficient parallel rectangular layout of FIG. 2, by providing trench isolation region 343 that extends along upper and lower boundary 62 of device 20, as shown in FIG. 2. This prevents stray current from passing around the upper and lower ends (see FIG. 2) of regions 40 and 38 at boundary 62 and forces current path 32 (e.g., see FIG. 1) to lie between regions 40 and 38, that is, through JFET 56. Stated another way, it is desirable that a blocking dielectric isolation region be provided parallel to the direction of anode-cathode current flow along the edges of the device so as to prevent "sneak current paths" around the ends of JFET 56 or equivalent. Any plan view shape that accomplishes this no significant "sneak paths" condition may be used for the relative positions of portions or regions 242, 50, 40, 38 and 28. As used herein, the term, "substantially closed" in reference to the plan view shape of portions or regions 242, 50, 40, 38 and 28 is used in that sense, that is, that no significant "sneak paths" exist between anode and cathode of the Schottky device around JFET 56 or equivalent under reverse bias conditions. Such regions may be concentric or, as illustrated for example in FIG. 2, a blocking dielectric or other boundary region (e.g., one or more PN junctions) may be used to force the anode-cathode conduction to flow in such a manner that no significant current portion flows outside of JFET 56 or equivalent.

P+ contact regions 40, 42 should preferably be doped in the range of about 1E20 to IE21 cm$^{-3}$. N regions 26, 46 should preferably be about two to three orders of magnitude lower doping but the exact choice will depend upon the ON-resistance sought by the Schottky device designer and the desired pinch-OFF voltage of JFET 56. P region 38 should preferably be doped at least in the range of about 1E17 to 1E18 cm$^{-3}$ and desirably somewhat greater than regions 46 but in other embodiments may have the same or smaller doping level than region 26 provided that it is thick enough that any penetration of depletion region 52, 53 into region 38 does not prevent portion 46 from pinching off. N region 48 should preferably be doped somewhat less strongly than adjacent buried region 38 but in other embodiments may have similar or larger doping levels than region 38 depending on the desired breakdown voltage. In still further embodiments, other doping levels for these various regions may also be used depending upon the properties desired by the device designer, using principles well known in the art. Thicknesses 41, 43, 44 are usefully in the range of about 0.1 to 0.2 micrometers, thickness 39 is usefully in the range of about 0.2 to 0.4 micrometers, and thickness 49 is usefully of the order of about 0.5 micrometers or larger, it not being critical, but larger or smaller values can also be used for these various thicknesses and will depend upon the particular process parameters available to the device designer and the desired device properties. While doping of the various SC regions illustrated in FIG. 1 may be provided by any doping method compatible with the remainder of the process technology needed to form the IC of which diode 20 is a part, ion implantation is preferred, the exact dopants and energies chosen depending upon the material of substrate 21 and the particular regions being formed. Chain implants are particularly useful and preferred. Chain implants comprise a succession of implants at different energies and/or doses, and sometimes different dopants, to form the desired dopant profile. Chain implants are well known and much used in the art, and are preferred because they are already available as a part of an overall IC formation process. However, they are not essential to the embodiments of the present invention described herein. Any means of providing the various doped regions illustrated in FIGS. 1-2 may be used. The lateral extent of the various device regions illustrated in FIGS. 1-2 are defined, using masking means well known in the art. Photoresist is a useful masking material for defining the lateral geometry of the various device regions, portions or elements. The use of photoresist and other mask materials for defining the lateral geometry of the various device regions of FIGS. 1-2 is well known in the art and accordingly not described in detail herein.

Figure 3:
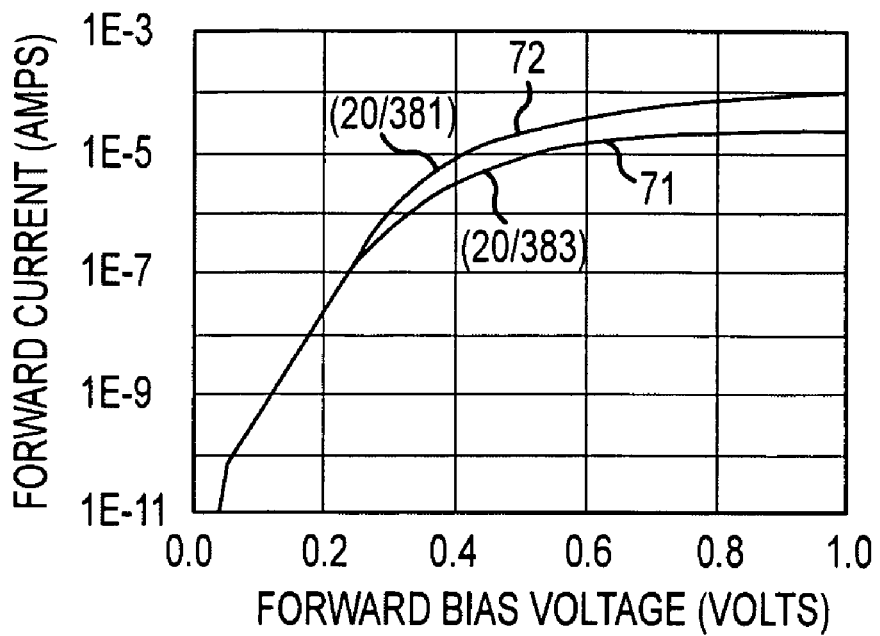
FIG. 3 is a plot of forward current versus forward voltage comparing the performance of two forms of the Schottky diode of FIG. 1-2.

FIG. 3 shows plot 70 of forward current (in Amperes) versus forward voltage (in Volts) comparing the performance of Schottky diodes 20 of FIGS. 1 and 2, with different locations for the lateral boundaries of buried region 38. Trace 71 shows the forward conduction characteristics of diode 20 of FIGS. 1-2 with the lateral boundary of region 38 at location 383 (referred to as configuration 20/383), and trace 72 shows the forward conduction characteristics of diode 20 of FIGS. 1-2 with the lateral boundary of buried region 38 at location 381 (referred to as configuration 20/381). It will be noted that diode 20 with configuration 20/381 has slightly lower ON-resistance above about 0.3 volts. The ON-resistance can be made lower by decreasing the lateral overlap between region 38 and region 40. As a trade-off, the clamp voltage under reverse bias and consequently the leakage current will generally increase with the reduction in lateral overlap. Conversely, the leakage current may be reduced by increasing the lateral overlap of regions 40 and 38, but at the expense of some increase in forward resistance. Accordingly, device 20 is said to be "tuneable", that is able to have its terminal properties varied to suit the needs of a particular application. This tuneability allows the device designer to choose the best combination or compromise between ON-resistance and reverse leakage to suit the needs of his or her particular application and is a desirable feature of the present invention.

Figure 4:
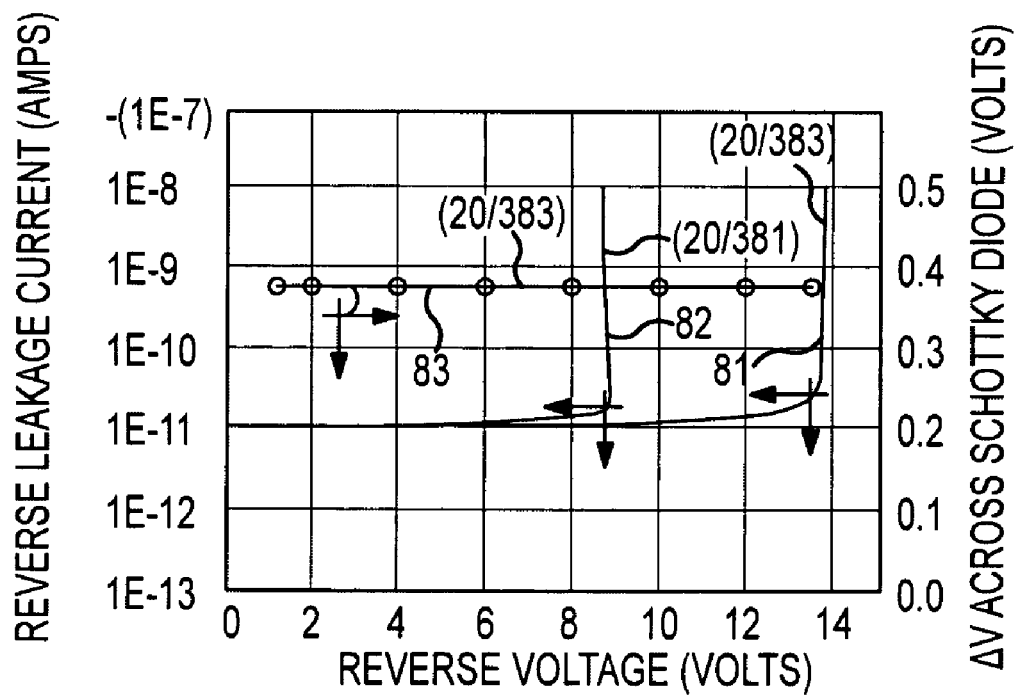
FIG. 4 is a plot of reverse current versus reverse voltage comparing the performance of two forms of the Schottky diode of FIGS. 1-2, and showing the voltage drop across the Schottky junction as a function of reverse voltage for a first form thereof

FIG. 4 shows plot 80 of reverse current (in Amperes) versus reverse voltage (in Volts) comparing the performance of Schottky diode 20 of FIGS. 1-2 for configurations 20/383 (trace 81) and configuration 20/381 (trace 82) as a function of the reverse bias voltage (in Volts). FIG. 4 also shows (trace 83) the voltage drop ($\Delta V$) across Schottky junction 50 formed by conductor portion 242 and surface 22 of region 26 of diode 20 of FIGS. 1-2 as a function of reverse bias voltage. Persons of skill in the art will understand that the polarity of the voltage and current in FIGS. 3 and 4 are opposite. Traces 81, 82 refer to the abscissa and left ordinate scale and trace 83 refers to the abscissa and right ordinate scale. It will be noted that Schottky diode 20 of configuration 20/383 (trace 81) tolerates a much higher voltage, e.g., about 13.5 volts, before the onset of significant reverse current (e.g., breakdown) as compared to Schottky diode 20 of configuration 20/381 (trace 82) wherein breakdown sets in at about 9 volts. The higher breakdown voltage of configuration 20/383 is a result of bulk breakdown occurring at junction 58 (see FIG. 1) between P type buried region 38 and underlying N type buried layer region 48, whereas in configuration 20/381 the breakdown is believed to occur between P+ region 40 and portion 46 of N type region 26. Thus, where higher reverse bias breakdown is needed, the arrangement of configuration 20/383 (or 20/384) of FIGS. 1-2 where the lateral periphery of P type buried region 38 extends laterally to or beyond outer periphery 402 of P+ region 40 is desirable. The bulk breakdown in diode 20 also allows greater freedom in obtaining the desired breakdown voltage through appropriate choice of the doping concentration in buried regions 38 and 48, which may be made to some extent without adversely affecting the properties of JFET 56, and therefore of the reduced reverse bias leakage of diode 20 incorporating JFET 56 as described herein. Conversely, where it is desired to have the lowest possible ON-resistance at higher forward voltages, the lateral periphery of region 38 can be located (e.g., in the vicinity of configuration 20/381) so as to reduce or eliminate the overlap of P type buried region 38 beneath inner periphery 401 of P+ region 40. This allows the designer to tailor the design of Schottky diode 20 to suit particular needs. This is an example of the flexibility of the invented embodiments.

Trace 83 shows the voltage drop ($\Delta V$) in volts across Schottky junction 50 at surface 22 of diode 20 of FIGS. 1-2 as a function of reverse bias voltage in volts for configuration 20/383 (trace 81). It will be observed that the voltage drop ($\Delta V$) is substantially constant up to the breakdown voltage of Schottky diode 20. This indicates that the electrical potential at Schottky junction 50, formed where conductor portion 242 meets surface 22 of SC region 26, is being clamped by series JFET 56 formed by P type regions 40, 38 (the "gates") across portion 46 (the "channel region") of N type region 26, and that the automatic action provided by the above-described embodiments provides a substantial increase in breakdown voltage and corresponding decrease in reverse bias leakage at higher reverse bias voltages.

According to a first embodiment, there is provided a Schottky diode (20) having first (312) and second (311) terminals, comprises, a semiconductor (SC) substrate (21) having a first region (26) of a first conductivity type and first doping concentration proximate a first surface (22) of the substrate (21), a Schottky contact forming conductor portion (242) on the first surface (22) of the first region (26) forming a Schottky junction (50) therebetween, with the Schottky contact forming conductor portion (242) ohmically coupled to the first terminal (312), a second region (28) of the first conductivity type and a second doping in the first region (26), laterally separated from the Schottky contact forming conductor portion (242) and ohmically coupled to the second terminal (311), a third region (38) of a second, opposite, conductivity type and third doping underlying the first region (26) and ohmically coupled to the first terminal (312), a fourth region (40) of the second conductivity type and fourth doping, located in the first region (26) proximate the first surface (22) and separated from the third region (38) by a portion (46) of the first region (26), and ohmically coupled to the first terminal 312, wherein the fourth region (40) and a part of the second region (38) separated by the portion (46) of the first region (26) form a junction field effect transistor (JFET) (56) with the fourth region (40) and the part of the second region (38) acting as gates of the JFET (56) and the portion (46) adapted to contain a channel of the JFET (56) through which a principal leakage current path (32) extends between the first (312) and second (311) terminals when the Schottky diode (20) is reverse biased, and wherein the channel of the JFET (56) through which the principal leakage current path (32) passes is adapted to automatically pinch-OFF as reverse bias voltage is increased beyond a predetermined level, thereby clamping a potential drop across the Schottky junction (50). According to a further embodiment, the third region (38) has a first lateral periphery (381) laterally within a first lateral periphery (401) of the fourth region (40). According to a still further embodiment, the third region (38) has a second lateral periphery (382) that lies laterally within the first lateral periphery (401) and a second more remote lateral periphery (402) of the fourth region (40). According to a yet further embodiment, the third region (38) has a third lateral periphery (383) that lies laterally beyond the second more remote lateral periphery (402) of the fourth region (40). According to a still yet further embodiment, the third region (38) has a fourth lateral periphery (384) that lies beyond a first lateral periphery (281) of the second region (28). According to a yet still further embodiment, a dielectric filled trench (343) substantially surrounds the diode (20). According to another embodiment, ends of the second and fourth regions are terminated by a dielectric filled trench (343). According to a still another embodiment, the current path (32) between the first (312) and second (311) terminals is constrained by the dielectric filled trench (343) to pass through the JFET (56). According to a yet another embodiment, the portion (46) of the first region (26) has a fifth doping less than the fourth doping. According to a still yet another embodiment, the fifth doping is less than the second doping. According to a yet still another embodiment, the fifth doping and thickness of the portion (46) of the first region (26) are adapted so that the portion (46) of the first region (26) becomes substantially depleted of free carriers as the diode (20) is reverse biased.

According to a second embodiment, there is provided a Schottky device (20) having an anode (312) and cathode (311), comprising, a semiconductor substrate (21) having a first surface (22), a Schottky junction (50) formed between a first conductor (242) and a part of the first surface (22) of the first region (26) of the first conductivity type, wherein the first conductor is coupled to the anode (312), a cathode contact (28) of the first conductivity type in a second region (29) of the substrate (21) ohmically coupled to the first region (26), laterally spaced apart from the Schottky junction (50), and ohmically coupled to the cathode (311), and a junction field effect transistor (JFET) (56) with its channel region (46) serially coupled in a current path (32) between the first conductor (242) and the cathode contact (28), wherein the JFET (56) has opposed gate regions (40, 38) electrically coupled to the anode (312). According to a further embodiment, the gate regions (40, 38) comprise a first doped gate region (40) of a second opposite conductivity type extending from the SC surface (22) into the substrate (21) above the current path (32). According to a still further embodiment, the gate regions (40, 38) comprise a second doped gate region (38) of a second opposite conductivity type located within the substrate (21) at a depth (27) from the surface (22) greater than a depth (41) of the first doped gate region (40) and underlying the current path (32). According to a yet further embodiment, the second doped gate region (38) is electrically coupled to the anode (312) by a doped sinker region (42, 36) of the second conductivity type having an upper portion (42) proximate the surface (22) and electrically coupled to the first conductor (242), and a lower portion (36) extending into the substrate (21) from the first portion (42) to reach the second doped gate region (38). According to a yet still further embodiment, the sinker region (42, 36) is centrally located with respect to the second doped gate region (38). According to a still yet further embodiment, the channel region (46) of the JFET (56) lies between a peripheral zone (385) of the second doped gate region (38) and the first doped gate region (40).

According to a third embodiment, there is provided a method for forming a Schottky device, comprising, providing a semiconductor substrate (21) having an upper surface (22) and a first region (26) of a first conductivity type proximate the upper surface (22), forming a buried region (38) of a second opposite conductivity type underlying the first region (26) and having a predetermined lateral periphery region (385) providing a sinker region (42, 36) of the second conductivity type extending about from the upper surface (22) to the buried region (38), forming a first doped region (40) of the second conductivity type in the first region (26) proximate the surface (22) and separated from the lateral periphery (381, 382, 383, 384, etc.) of the buried region by a channel portion (46) of the first region (26), providing a second doped region (28) of the first conductivity type in the first region (26) or an adjacent region (29) of the first conductivity type ohmically coupled to the first region (26), and laterally spaced apart from the first doped region (40), depositing a Schottky forming conductor (242) on the first surface (22) of the substrate (21) in a region laterally lying between the sinker region (42, 36) and the first doped region (40), thereby forming a Schottky junction (50) at such conductor (242)-semiconductor (26) interface (22) in ohmic contact with the first gate region (40) and in ohmic contact with the buried gate region (38) via the sinker region (42. 36), and wherein the first doped region (40) and the buried region (38) form gates of a JFET (56) having the channel region (46) therebetween so that the channel region (46) is serially coupled in a current path (32) between the conductor (242) and the second doped region (28). According to a further embodiment, the current path (32) passing through the channel region (46) of the JFET (56) comprises the only significant reverse current path between the conductor (242) and the second doped region (28). According to a still further embodiment, the first doped gate region (40) and the second doped region (28) are more highly doped than the first region (26).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A Schottky diode having first and second terminals, comprises:
    a semiconductor (SC) substrate having a first region of a first conductivity type and first doping concentration proximate a first surface of the substrate;
    a Schottky contact forming conductor portion on the first surface of the first region forming a Schottky junction therebetween, with the Schottky contact forming conductor portion ohmically coupled to the first terminal;
    a second region of the first conductivity type and a second doping in the first region, laterally separated from the Schottky contact forming conductor portion and ohmically coupled to the second terminal;
    a third region of a second, opposite, conductivity type and third doping underlying the first region and ohmically coupled to the first terminal;
    a fourth region of the second conductivity type and fourth doping, located in the first region proximate the first surface and separated from the third region by a portion of the first region, and ohmically coupled to the first terminal;
    wherein the fourth region and a part of the second region separated by the portion of the first region form a junction field effect transistor (JFET) with the fourth region and the part of the second region acting as gates of the JFET and the portion adapted to contain a channel of the JFET through which a principal leakage current path extends between the first and second terminals when the Schottky diode is reverse biased, and wherein the channel of the JFET through which the principal leakage current path passes is adapted to automatically pinch-OFF as reverse bias voltage is increased beyond a predetermined level, thereby clamping a potential drop across the Schottky junction.

2. The diode of claim 1, wherein the third region has a first lateral periphery laterally within a first lateral periphery of the fourth region.

3. The diode of claim 1, wherein the third region has a second lateral periphery that lies laterally within a second lateral periphery laterally beyond the first lateral periphery of the fourth region.

4. The diode of claim 1, wherein the third region has a third lateral periphery that lies laterally beyond the second lateral periphery of the fourth region.

5. The diode of claim 1, wherein the third region has a fourth lateral periphery that lies beyond a first lateral periphery of the second region.

6. The diode of claim 1, wherein a dielectric filled trench substantially surrounds the diode.

7. The diode of claim 1, wherein ends of the second and fourth regions are terminated by a dielectric region.

8. The diode of claim 7, wherein the current path between the first and second terminals is constrained by the dielectric region to pass through the JFET.

9. The diode of claim 1, wherein the portion of the first region has a fifth doping less than the fourth doping.

10. The diode of claim 9, wherein the fifth doping is less than the second doping.

11. The diode of claim 9, wherein the fifth doping and thickness of the portion of the first region are adapted so that the portion of the first region becomes substantially depleted of free carriers as the diode is reverse biased.

12. A Schottky device having an anode and cathode, comprising:
    a semiconductor substrate having a first surface and a first region of a first conductivity type adjacent the first surface;
    a Schottky junction formed between a first conductor and a part of the first surface of the first region of the first conductivity type, wherein the first conductor is coupled to the anode;
    a cathode contact of the first conductivity type in a second region of the substrate ohmically coupled to the first region, laterally spaced apart from the Schottky junction, and ohmically coupled to the cathode; and
    a junction field effect transistor (JFET) having a channel region serially coupled in a current path between the first conductor and the cathode contact, wherein the JFET has opposed gate regions electrically coupled to the anode, wherein the gate regions comprise:
        a first doped gate region of a second opposite conductivity type extending from the SC surface into the substrate above the current path, and
        a second doped gate region of a second opposite conductivity type located within the substrate at a depth from the surface greater than a depth of the first doped gate region and underlying the current path, and wherein the second doped gate region is electrically coupled to the anode by a doped sinker region of the second conductivity type having an upper portion proximate the surface and electrically coupled to the first conductor, and a lower portion extending into the substrate from the first portion to reach the second doped gate region.

13. The device of claim 12, wherein the sinker region is centrally located with respect to the second doped gate region.

14. The device of claim 13, wherein the channel region of the JFET lies between a peripheral zone of the second gate region and the first doped gate region.

15. A method for forming a Schottky device, comprising:
    providing a semiconductor substrate having an upper surface and a first region of a first conductivity type proximate the upper surface;
    forming a buried region of a second opposite conductivity type underlying the first region and having a predetermined lateral periphery region;
    providing a sinker region of the second conductivity type extending about from the upper surface to the buried region;
    forming a first doped region of the second conductivity type in the first region proximate the surface and separated from the buried region by a channel portion of the first region;
    providing a second doped region of the first conductivity type in the first region or an adjacent region of the first conductivity type ohmically coupled to the first region, and laterally spaced apart from the first doped region; and
    depositing a Schottky forming conductor on the first surface of the substrate in a region laterally lying between the sinker region and the first doped region, thereby forming a Schottky junction at such conductor—semiconductor interface in ohmic contact with the first doped region and in ohmic contact with the buried gate region via the sinker region; and wherein the first doped region and the buried region form gates of a JFET having the channel region therebetween so that the channel region is serially coupled in a current path between the conductor and the second doped region.

16. The method of claim 15, wherein the current path passing through the channel region of the JFET comprises the only significant reverse current path between the conductor and the second doped region.

17. The method of claim 15, wherein the first doped region and the second doped region are more highly doped than the first region.

* * * * *